United States Patent
Wang

(10) Patent No.: US 8,378,709 B2
(45) Date of Patent: Feb. 19, 2013

(54) DIRECT CURRENT REGULATED POWER SUPPLY

(75) Inventor: Hai-Li Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 362 days.

(21) Appl. No.: 12/846,759

(22) Filed: Jul. 29, 2010

(65) Prior Publication Data

US 2011/0292706 A1     Dec. 1, 2011

(30) Foreign Application Priority Data

May 31, 2010    (CN) .......................... 2010 1 0187288

(51) Int. Cl.
*G01R 31/40*       (2006.01)
(52) U.S. Cl. .................... 324/764.01; 703/340
(58) Field of Classification Search .................. 363/146, 363/147; 703/340; 324/764.01
See application file for complete search history.

(56) References Cited

U.S. PATENT DOCUMENTS

| | | | | |
|---|---|---|---|---|
| 5,091,715 | A * | 2/1992 | Murphy | 340/604 |
| 5,590,343 | A * | 12/1996 | Bolan et al. | 713/300 |
| 5,708,819 | A * | 1/1998 | Dunnihoo | 713/323 |
| 7,312,614 | B2 * | 12/2007 | Peng | 324/538 |
| 7,746,081 | B2 * | 6/2010 | Slaton | 324/539 |
| 7,746,115 | B2 * | 6/2010 | Huang et al. | 326/83 |
| 7,930,579 | B2 * | 4/2011 | Yuan et al. | 713/340 |
| 2008/0122477 | A1 * | 5/2008 | Yuan et al. | 324/771 |

* cited by examiner

*Primary Examiner* — Jessica Han
(74) *Attorney, Agent, or Firm* — Altis Law Group, Inc.

(57) ABSTRACT

A direct current regulated power supply includes a switch power supply, a power connector, and a control switch. The switch power supply is configured for receiving a main power and converting the received main power into direct current power to supply an electronic device. The power connector is electrically coupled to the switch power supply, and includes an enable pin. The control switch includes an input electrically coupled to the enable pin of the power connector, and an output that is grounded.

6 Claims, 2 Drawing Sheets

DIRECT CURRENT REGULATED POWER SUPPLY

BACKGROUND

1. Technical Field

The present disclosure relates to a direct current regulated power supply.

2. Description of Related Art

Direct current regulated power supplies are used in a computer host for converting main power into direct current (DC) power supply for hardware (such as hard disk, CD-ROM drive) of the computer host.

Before shipment, the hardware of the computer host must be tested. However, as each test is required to insert the power connector onto a main power socket of a motherboard of the computer host. Then the motherboard sends an enable signal (low level signal) to an enable pin that is a sixteenth-pin of the power connector to enable the switching power supply to work to provide power to all the hardware needed for work via the output lines. This process needs to turn on the motherboard for each test, which is not only inconvenient to use, but also resulted in waste of energy.

Therefore, it is desirable to provide a direct current regulated power supply which can overcome the above-mentioned problems.

BRIEF DESCRIPTION OF THE DRAWINGS

Many aspects of the present disclosure can be better understood with reference to the accompanying drawings. The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

Embodiments of the present disclosure will now be described in detail below and with reference to the drawings.

Figure 1:
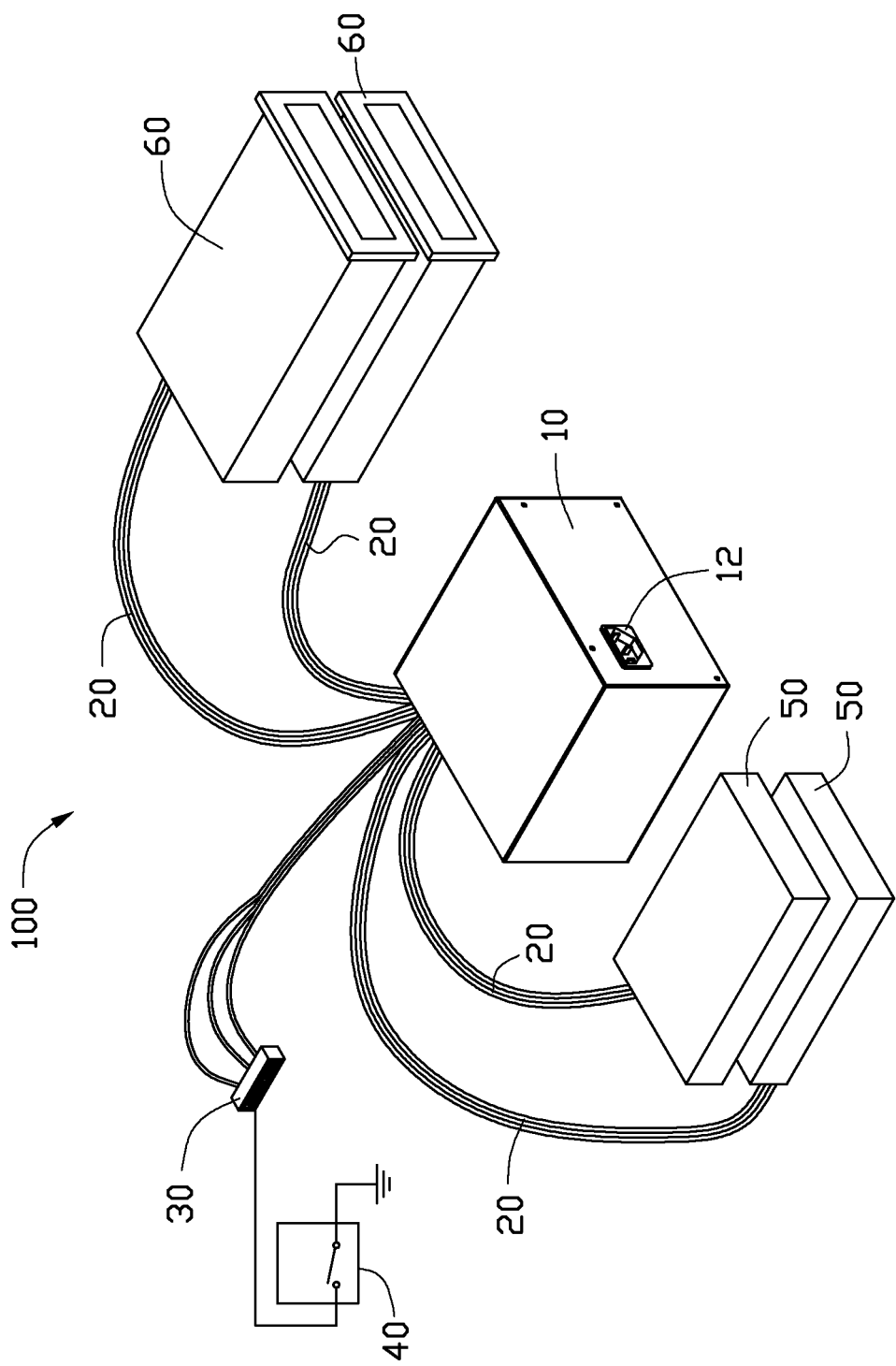
FIG. 1 is an isometric and schematic view of a direct current regulated power supply according to an exemplary embodiment.

Referring to FIG. 1, a direct current regulated power supply (hereinafter power supply) 100, according to an exemplary embodiment, is configured for supplying power for the testing of an electronic device. In this present embodiment, the electronic device may be the hardware in a computer host, such as hard disks 50 or CD-ROM drives 60. The power supply 100 includes a switch power supply 10, a number of output lines 20, a power connector 30, and a control switch 40.

The switch power supply 10 includes a main power input port 12 for receiving a main power. The switch power supply 10 is configured for converting the received main power into direct current (DC) power for use by the hard disks 50 and the CD-ROM drives 60 of the computer host.

The number of output lines 20 are electrically coupled to the switch power supply 10. The output lines 20 are configured for conveying the DC power converted by the switch power supply 10 to the hard disks 50 and the CD-ROM drives 60.

Figure 2:
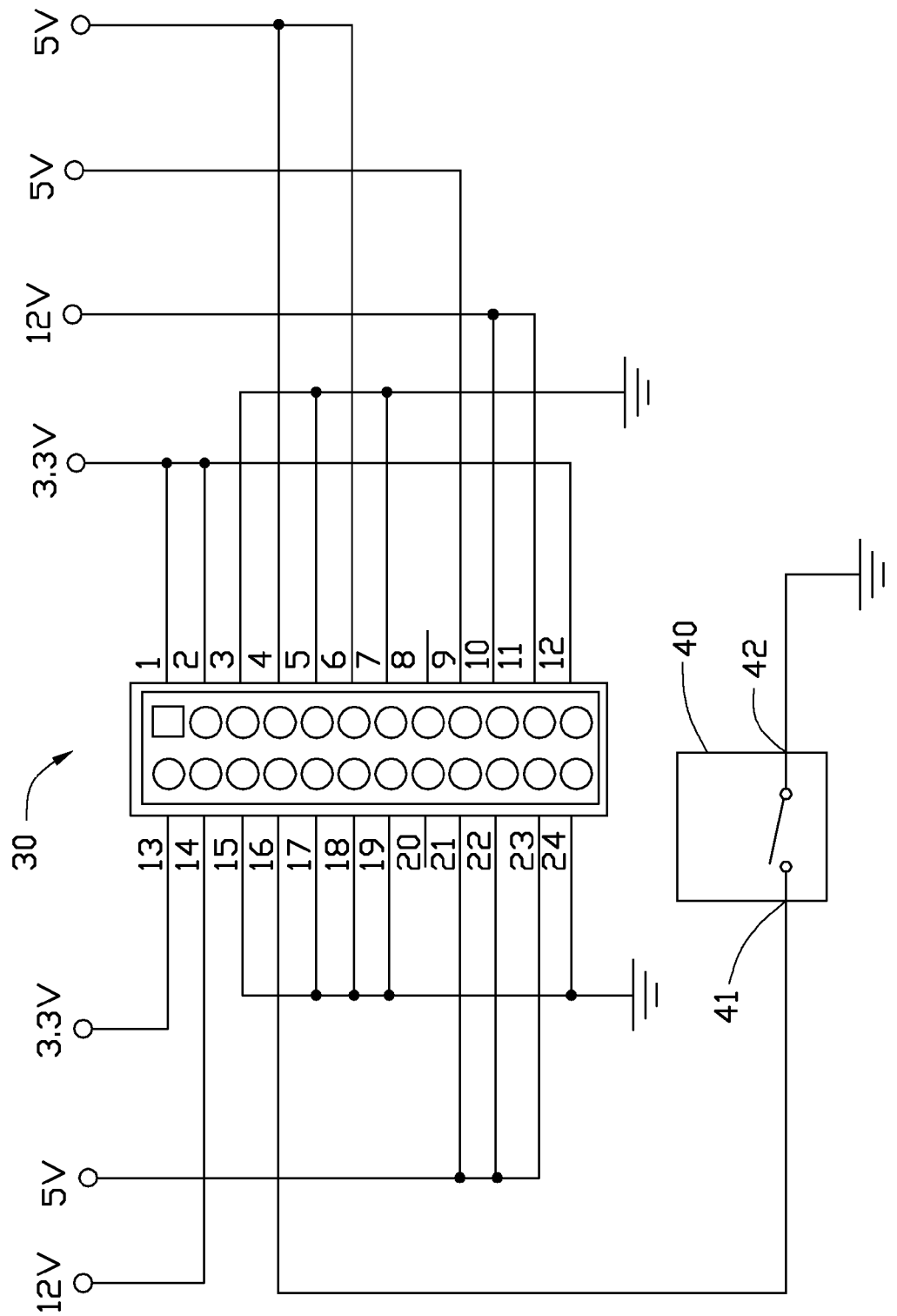
FIG. 2 is a schematic view of a power connector of the direct current regulated power supply of FIG. 1.

The power connector 30 is also electrically coupled to the switch power supply 10 via the output lines 20. Also referring to FIG. 2, the power connector 30 includes twenty-four pins. The first, second, twelfth, and thirteenth pins are configured for outputting 3.3V DC power. The third, fifth, seventh, fifteenth, seventeenth, eighteenth, nineteenth, and the twenty fourth pins are grounded. The fourth, sixth, ninth, twenty first, twenty second, and twenty third pins are configured for outputting 5V DC power. The tenth, eleventh, fourteenth pins are configured for outputting 12V DC power. The eighth and twentieth pins are vacant. The sixteenth pin is an enable pin. When the sixteenth pin receives an enable signal (low level signal), both the power connector 30 and the switch power supply 10 begin to work.

The control switch 40 includes an input 41 and an output 42. The input 41 is electrically coupled to the sixteen pin of the power connector 30. The output 42 is grounded.

In test of the hard disks 50 and the CD-ROM driver 60, the enable pin of the power connector 30 is grounded by pressing the control switch 40, as a result, a low level signal is supplied to the enable pin of the power connector 30 to activate the power connector 30 and the control switch 40. As such, the testing power can be distributed to each of the hardware in the computer host without staring or activating the motherboards of the computer host. In addition, the power connector 30 can provide various direct currents with different voltages for example 3.3, 5V, 12V DC, therefore it can be used as DC power supply.

It will be understood that the above particular embodiments and methods are shown and described by way of illustration only. The principles and the features of the present invention may be employed in various and numerous embodiments thereof without departing from the scope of the invention as claimed. The above-described embodiments illustrate the scope of the invention but do not restrict the scope of the invention.

What is claimed is:

1. A direct current regulated power supply for the testing of an electronic device, comprising:
   a switch power supply;
   a power connector electrically coupled to the switch power supply, and comprising twenty four pins, the sixteenth pin being an enable pin, the first, second, twelfth, and thirteenth pins of the power connector configured for outputting a 3.3V DC power supply; the third, fifth, seventh, fifteenth, seventeenth, eighteenth, nineteenth, and the twenty fourth pins of the power connector being grounded; the fourth, sixth, ninth, twenty first, twenty second, and twenty third pins of the power connector configured for outputting a 5V DC power supply; the tenth, eleventh, fourteenth pins of the power connector configured for outputting a 12V DC power supply; the eighth and twentieth pins of the power connector being vacant; and
   a control switch comprising an input electrically coupled to the enable pin of the power connector, and a grounded output.

2. The direct current regulated power supply of claim 1, wherein when the control switch is turned on, the enable pin of the power connector is grounded, a low level signal is supplied to the enable pin of the power connector to activate the power connector and the control switch.

3. The direct current regulated power supply of claim 1, wherein the switch power supply device comprises a main power inputting port.

4. A direct current regulated power supply for the testing of an electronic device, comprising:

a plurality of output lines;

a switch power supply;

a power connector electrically coupled to the switch power supply via the output lines, and comprising twenty four pins, the sixteenth pin being an enable pin, the first, second, twelfth, and thirteenth pins of the power connector configured for outputting a 3.3V DC power supply; the third, fifth, seventh, fifteenth, seventeenth, eighteenth, nineteenth, and the twenty fourth pins of the power connector being grounded; the fourth, sixth, ninth, twenty first, twenty second, and twenty third pins of the power connector configured for outputting a 5V DC power supply; the tenth, eleventh, fourteenth pins of the power connector configured for outputting a 12V DC power supply; the eighth and twentieth pins of the power connector being vacant; and a control switch comprising an input electrically coupled to the enable pin of the power connector, and a grounded output.

5. The direct current regulated power supply of claim 4, wherein when the control switch is turned on, the enable pin of the power connector is grounded, a low level signal is supplied to the enable pin of the power connector to activate the power connector and the control switch.

6. The direct current regulated power supply of claim 4, wherein the switch power supply comprises a main power inputting port.

* * * * *